United States Patent [19]

Van Peski et al.

[11] Patent Number: 4,521,114
[45] Date of Patent: Jun. 4, 1985

[54] SINGLE LENS REPEATER

[75] Inventors: Christian K. Van Peski, Hidden Hills; William L. Meisenheimer, Agoura, both of Calif.

[73] Assignee: TRE Semiconductor Equipment Corporation, Woodland Hills, Calif.

[21] Appl. No.: 330,498

[22] Filed: Dec. 14, 1981

Related U.S. Application Data

[63] Continuation of Ser. No. 238,148, Feb. 25, 1981, abandoned, which is a continuation of Ser. No. 38,349, May 11, 1979, abandoned.

[51] Int. Cl.$^3$ .................... G01B 11/00; B25B 11/00
[52] U.S. Cl. ........................... 356/401; 269/21
[58] Field of Search ............... 356/138, 153, 399–401; 355/73, 76, 87, 91–92, 132; 250/492.2, 548; 269/21, 46, 73; 209/537

[56] References Cited

U.S. PATENT DOCUMENTS

| | | | |
|---|---|---|---|
| 2,735,731 | 2/1956 | Freebairn et al. | 308/2 A |
| 3,899,728 | 8/1975 | Hoppe | 356/383 |
| 3,914,754 | 10/1975 | Kirk | 73/37 |
| 3,955,163 | 5/1976 | Novak | 355/132 |
| 4,026,653 | 5/1977 | Appelbaum et al. | 355/91 |
| 4,052,603 | 10/1977 | Karlson | 356/400 |
| 4,153,371 | 5/1979 | Koizumi et al. | 356/401 |

FOREIGN PATENT DOCUMENTS 2307096  8/1974  Fed. Rep. of Germany ........ 269/21

OTHER PUBLICATIONS

Bordt, H., "Wafer Adjusting Arrangement", IBM Tech. Disc. Bull., vol. 14, 10–1971, pp. 1604–1605.
Machen, J. F., "Flexure Devices-For", Machen Products Co., Toledo.

Primary Examiner—William H. Punter
Attorney, Agent, or Firm—Spensley Horn Jubas & Lubitz

[57] ABSTRACT

In this step and repeat wafer direct exposure system, the initial reticle contains an alignment target which is repetitively exposed onto the semiconductor wafer at each circuit image location. Each subsequently used reticle contains a complementary shaped alignment pattern. At each array location, a low intensity light source is used for through-the-camera-lens alignment. Viewing optics and a video camera are used simultaneously to view the virtual image of the alignment target situated on the wafer and the corresponding alignment pattern situated on the reticle. While viewing, the stage is moved to achieve perfect alignment, after which the circuit pattern is exposed from the reticle onto the wafer. The wafer then is stepped and the process repeated at other array positions.

The apparatus includes an air gauge system for automatically locating the wafer center and aligning the wafer below the exposure camera. In conjunction with a spherical air bearing support for the wafer, the air gauge also is used to achieve perfect parallel alignment between a portion of the wafer's surface and a reference plane of the camera.

10 Claims, 11 Drawing Figures

U.S. Patent   Jun. 4, 1985   Sheet 1 of 4   4,521,114
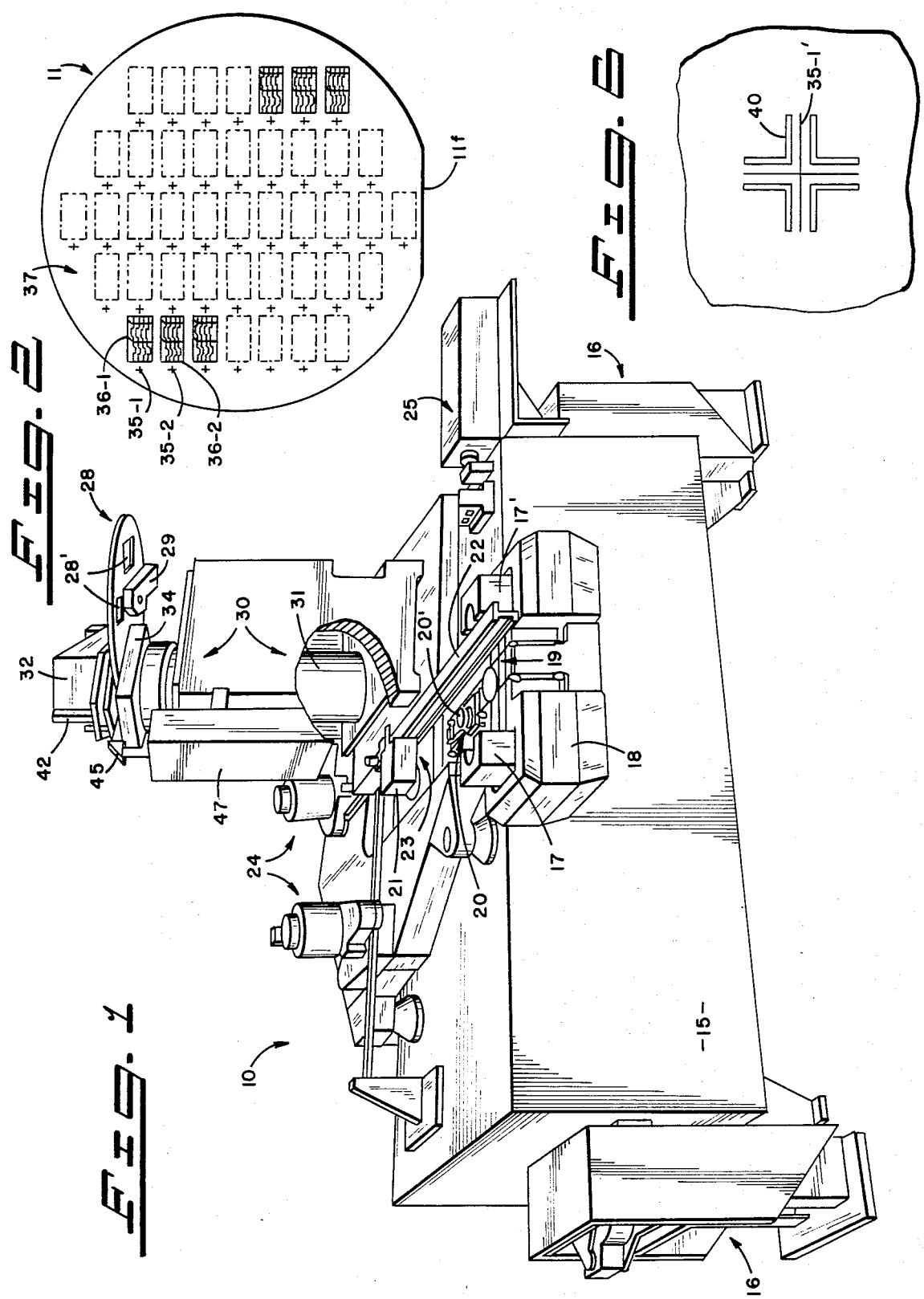

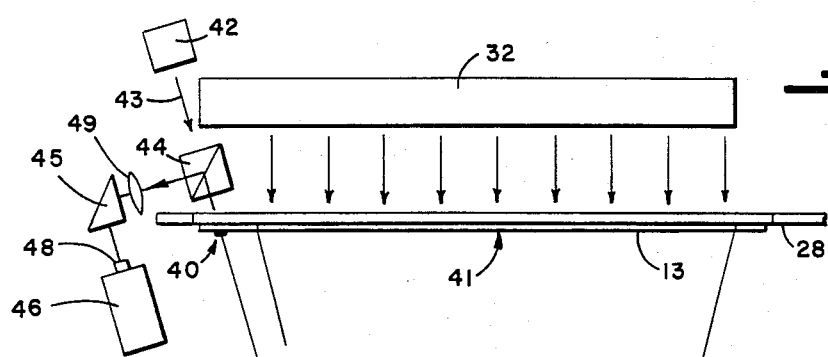
Fig. 5
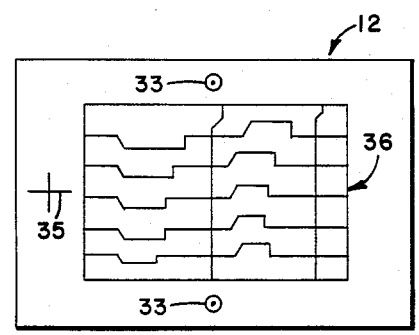
Fig. 3
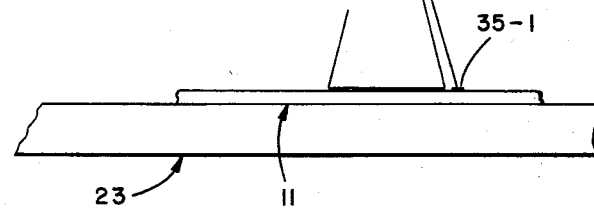
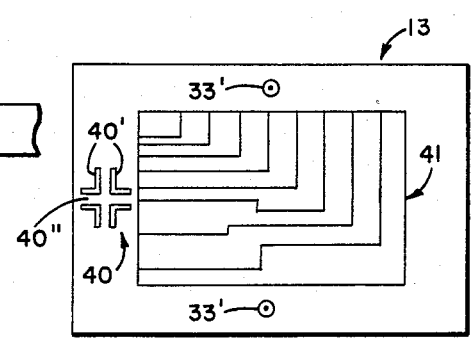
Fig. 4

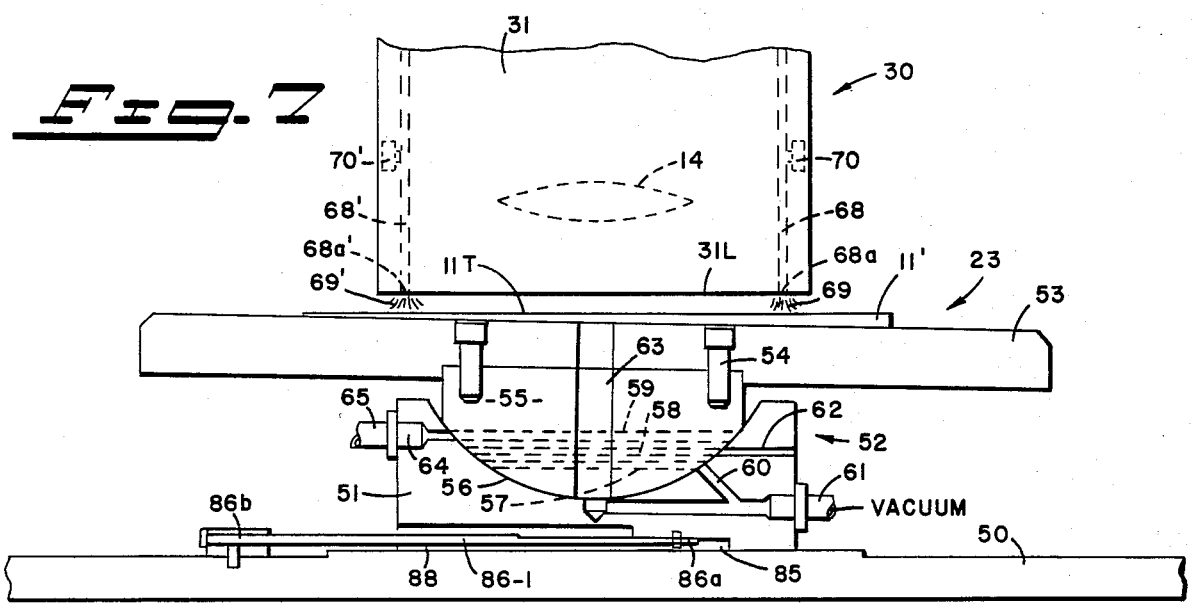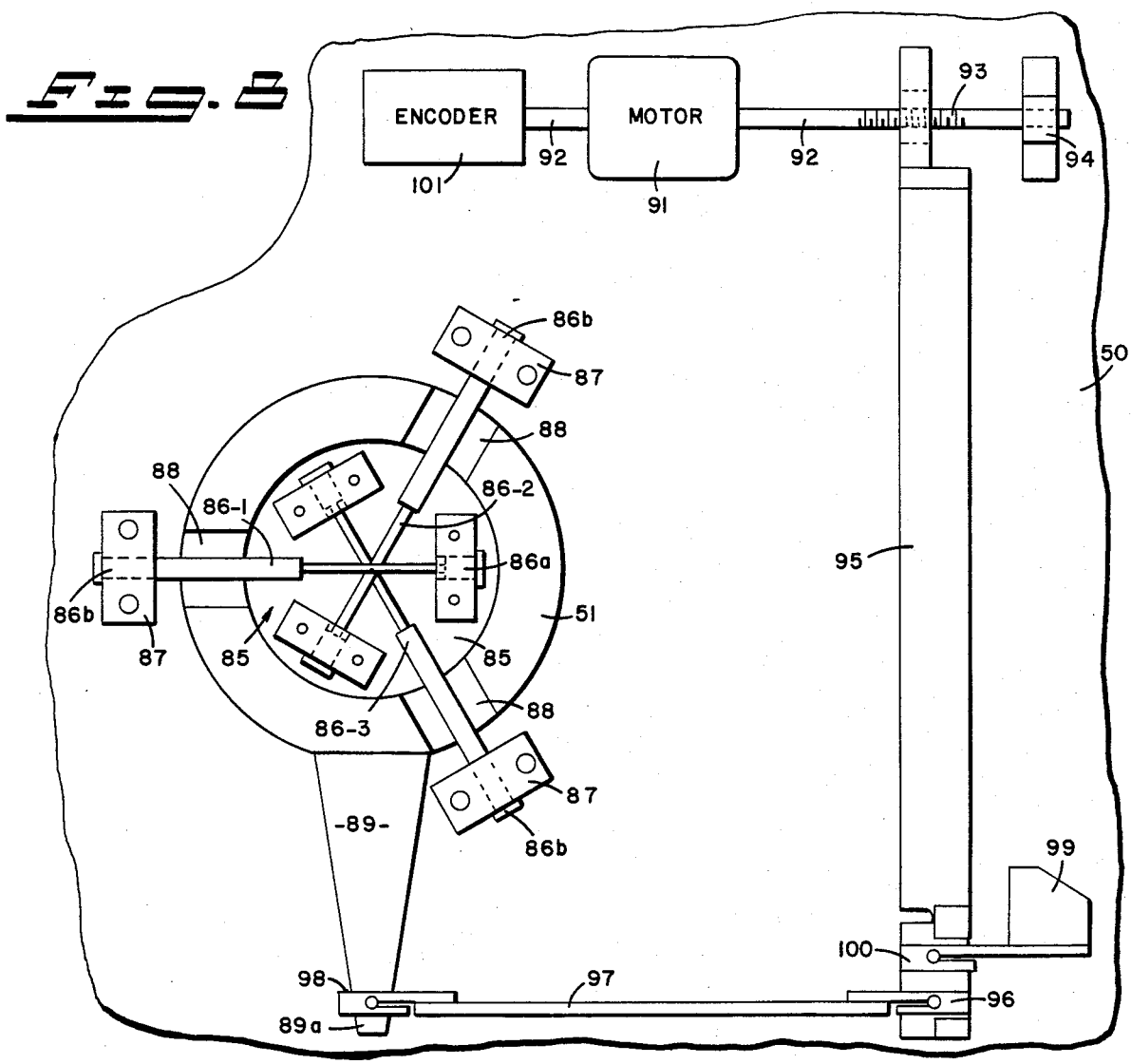

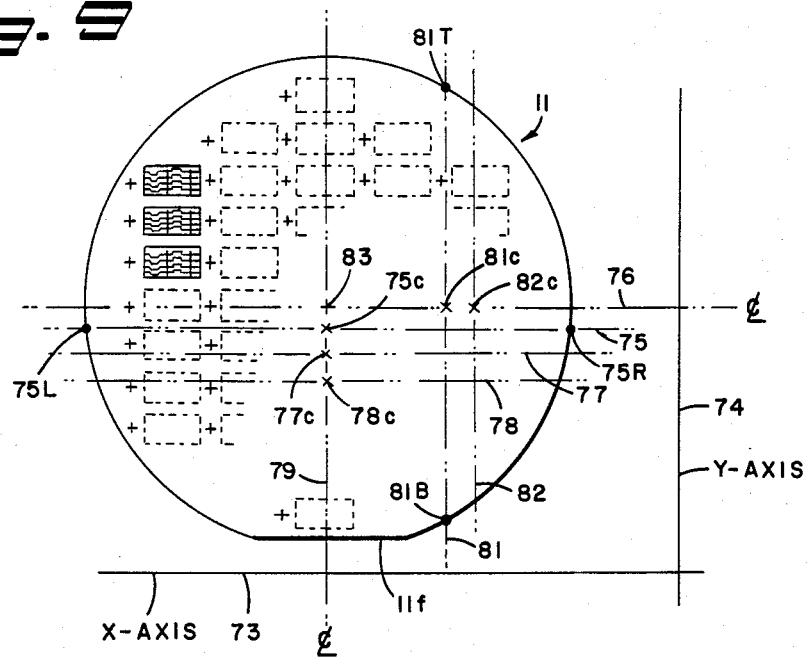
Fig. 9
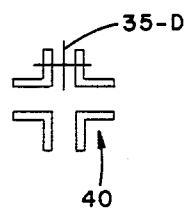
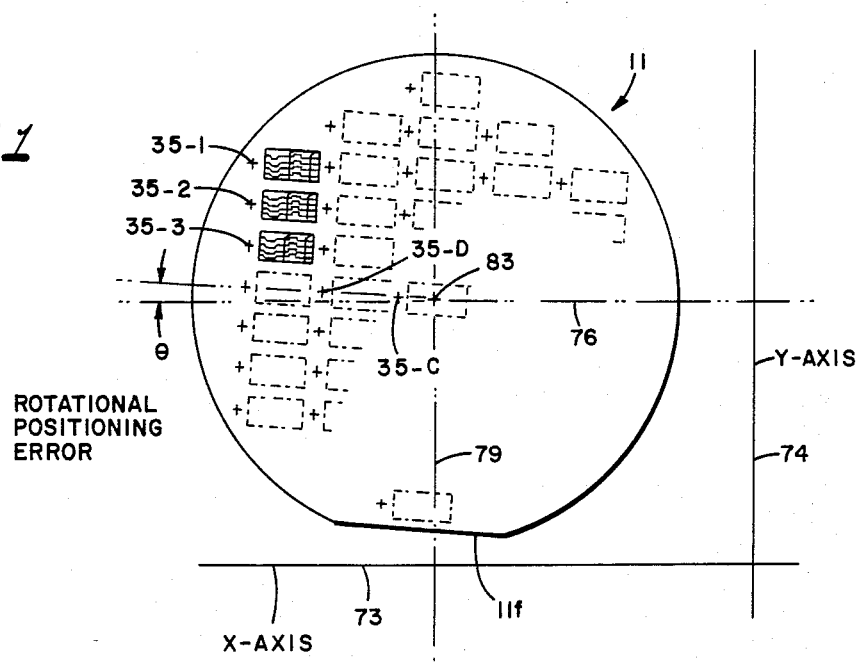
Fig. 10
Fig. 11

SINGLE LENS REPEATER

This is a continuation of application Ser. No. 238,148 filed Feb. 25, 1981, now abandoned, which is in turn a continuation of application Ser. No. 038,349, filed May 11, 1979, now abandoned.

BACKGROUND OF THE INVENTION

1. Field of the Invention

The present invention relates to a step and repeat direct exposure system for repeatedly exposing a semiconductor wafer to a circuit or device pattern on a reticle. The invention also relates to such a system in which during the initial masking operation an alignment target is placed on the wafer at each circuit location. During subsequent masking operations, image alignment is achieved by viewing through the image exposure lens both the reticle alignment pattern and the virtual image of an alignment target on the wafer.

2. Description of the Prior Art

In the fabrication of integrated circuits and discrete semiconductor devices, many identical devices or circuits are formed simultaneously on a single semiconductor wafer. Typically the wafer is of silicon, and has a diameter on the order of three to five inches. Depending on the size of the device or circuit, upwards of fifty, a hundred or more such items may be formed on a single wafer. At the end of the fabrication process, the wafer is scribed and split to form separate dies each containing an individual device or circuit. These dies then are separately packaged to complete the fabrication.

Many successive process operations are carried out on each wafer. The number and type of such process steps will differ depending on the type of device that is being fabricated. For example, different process steps will be used to form circuits having bipolar transistors, metal gate field effect transistors, silicon gate field effect transistors, or C-MOS (complementary metal-oxide semiconductor) devices, to name but a few. Common to all of these processes, however, is the necessity for photographically defining specific areas within each circuit or device at which process operations occur. From as few as three to as many as twelve such photographic "masking" operations are carried out on each wafer during the fabrication process.

By way of example, consider a very simple metal gate field effect transistor (FET) fabrication process. Initially, the silicon wafer is covered with a relatively thick field oxide layer of silicon dioxide. This is covered with a light sensitive photoresist material which is exposed to light through a first photographic mask to define the regions at which the individual FET's are to be formed. The exposed and developed photoresist acts as a shield to allow selective etching away of the field oxide in the regions where FET's are to be made.

A thin gate oxide layer then is grown directly on the silicon substrate in these exposed regions. Another photoresist step employing a second photographic mask is used to define the locations of the source and drain of each FET. Openings are formed through the thin gate oxide layer at the locations defined by this source-drain mask. Dopant material is diffused through the openings to form the source and drain. This diffusion operation takes place at a high temperature, typically on the order of 1100 degrees C. Simultaneously oxide is grown to cover the source and drain openings.

Next, a third photographic mask is used to define the locations of the metal gate electrode, the metal contacts to the source and drain regions, and the bonding pad locations for each FET element.

Next, a thick vapor deposited oxide is grown over the entire device as a protective coating. Finally, a fourth photographic mask is used to define the locations at which the vapor deposited oxide will be removed to expose the bonding pads for the FET gate, source and drain. The oxide is etched away in these defined locations to expose the metal pad regions to which electrical contact wires subsequently will be bonded.

Thus in this simple example, four separate photographic masks are utilized. It is of utmost importance that each successive mask be properly aligned with the circuit or device patterns that were defined by the earlier masking steps. This alignment is critical to proper functioning of the completed device. For example, in the FET process just described, the positioning of the third mask used to define the location of the metal gate electrode is very critical. The gate region must be precisely located above the gate oxide between the source and drain openings. Misregistration could caused the gate electrode to overlap the source or drain, thereby degrading FET performance, or worse yet, causing a short circuit from the gate to the source or drain, thereby rendering the device inoperative.

The problem of mask misregistration becomes even more critical as the density of individual components in each integrated circuit increases. To form an integrated circuit having a large number of individual components requires that each of these components be extremely small. In today's integrated circuits, element spacings as small as 2 micrometers may be demanded. Such fine resolution places exceedingly close tolerance demands on the registration of successive photographic masks during the fabrication process. Indeed, the degree to which such successive registration can be achieved is one of the principle factors limiting the density or number of devices per square centimeter that can be achieved in large scale integrated circuits.

The illustrative process described above concerned the fabrication of a single FET device. In practice, multiple devices, or multiple circuits each of which includes many individual devices, are fabricated on a single wafer. To accomplish this in the past, each photographic mask constituted a glass plate containing multiple identical pattern images at locations corresponding to the plural devices or circuits being fabricated on a single wafer. For example, if fifty identical circuits are being formed on the wafer in five rows of ten circuits each, then each mask would contain fifty identical patterns, precisely arranged in the corresponding array of five rows and ten columns.

The actual photographic exposure of the wafer being processed is carried out in the following manner. The wafer is placed on a holder or stage which is situated under a binocular microscope. The mask or reticle itself (i.e., the glass plate with multiple photographic images on it) is mounted in a holder directly above the wafer, but below the microscope. An operator views both the mask and wafer through the microscope, and physically manipulates either the stage or the mask holder until alignment is achieved, as determined by visual inspection. A single high intensity light source then is used simultaneously to expose the entire wafer through the entire mask. That is, the wafer is exposed simultaneously to all of the individual patterns arrayed on the mask.

Certain alignment problems are inherent in this process. The first occurs in the fabrication of the mask itself. Normally this is done by repetitive exposure from enlarged artwork that contains the pattern for a single one (or possible a few) of the devices being fabricated on the wafer. This individual pattern is exposed successively into each array position on the mask. Positioning errors can occur. For example, one or more images may be slightly out of line or skewed with respect to the rows or columns of other images on the same mask. If this should happen, even if perfect registration were achieved between the wafer and every other mask used during device fabrication, the misregistration of certain patterns in this individual mask well may result in defective devices or circuits.

Even if perfect positioning of each individual image in the mask array can be achieved, misregistration still can occur during the exposure process. For example, the operator may align the mask with the wafer by using only one or two reference points near the center or near an edge of the wafer and mask. If the mask is slightly skewed with respect to the wafer, as for example if the mask were rotated very slightly so that its center line was not exactly parallel to the center line of the wafer, this error may not be noticed by the operator. For example, if the operator viewed the mask and wafer only near the center, within the limited field of vision of the microscope the mask and wafer may appear to be aligned. However, at the periphery of the wafer the mask may be offset by an amount which, though very small, may be enough to cause misregistration sufficient to impair device operation.

Another complication arises as a result of the thermal cycling of the wafer itself during certain process steps. For example, in the process described above the source and drain diffusion is carried out at very high temperature. Typically the wafer will be subjected to may such steps in which its temperature is changed from room temperature to a highly elevated temperature and then returned once again to room temperature. This thermal cycling may produce some irregular warping of the wafer itself. As a result, even if the photographic masks themselves are perfect, the image they produce on a warped wafer may be out of registration with the images formed during earlier process steps which were carried out before the wafer became warped.

Many of these misregistration problems are eliminated by a system in which a mask with multiple images is totally eliminated. Instead, a reticle containing a single pattern corresponding to one, or at most a very few, of the circuits or devices to be formed on a wafer is employed for direct exposure onto the wafer itself. That is, at each masking operation a single mask with multiple images is not used. Rather, the reticle with its single pattern is used repetitively and successively to expose, one at a time, all of the devices or circuits being formed on the wafer. In such a direct exposure system, the reticle is mounted in a projection camera that is situated above a stage holding the wafer. One device or circuit of the wafer is aligned under the camera, and the exposure for that circuit is made through the reticle. The wafer then is stepped to the next circuit location, for example by moving the stage appropriately in the row or column direction. The next circuit then is exposed through the reticle. The process is repeated for each of the multiple circuits or devices on the wafer.

This direct exposure, wafer stepping technique can totally eliminate the misregistration problems associated with forming a mask having mutiple images, and using that mask simultaneously to expose all of the circuits at once. It offers yet an additional advantage in that the size of the reticle used to expose the image can be much larger (e.g., five time or ten times larger) than the actual size of the circuit being formed. This is in contrast with the mutiple image mask technique in which the individual images have a one-to-one size relationship with the circuits or devices on the wafer. The use of such an enlarged pattern to make the exposure onto the wafer, through optical size reduction, offers the opportunity to produce image geometries of smaller dimensions then can be achieved through a one-to-one masking operation.

Certain problems are posed by a direct exposure, wafer stepping system. These relate principally to alignment of the reticle image with previously exposed patterns on the wafer. In prior art systems, only a single alignment was done for each masking operation, regardless of how many individual reticle exposures were made. A pair of alignment targets were placed on opposite sides of the wafer either prior to or during the inital masking operation. A high precision stage translation device, typically using a laser interferometer for motion control, then was used to step the wafer to each array position between successive exposures. At the next and each successive masking operation, an indirect off axis method was used initially to align the wafer with the new reticle.

To accomplish this, each reticle was provided with a pair of reference targets. Initially the reticle was manually aligned to a reference at an off-axis portion of the camera, using these reference targets. Next a wafer was placed on the wafer stage and separately aligned to the same off-axis reference in the camera. As successive individual exposures were made, proper positioning of the state depended on the accuracy of the mechanical X-Y drive system. No individual alignment of each circuit with respect to the camera and reticle is made, and none is possible. Such alignment depends entirely on the precision with which the stage can be controlled by its positioning system. Substantial opportunity exists for the introduction of positioning error.

An object of the present invention invention is to provide an improved direct exposure, step and repeat imaging system which overcomes the disadvantages of the prior art. Another objective of the present invention is to provide a direct exposure system in which alignment of the reticle and target is carried out through the camera optics. A further objective is to provide a system in which an individual alignment target may be provided at each separate circuit location on the wafer, and in which an individual alignment can be made at each array location before every exposure.

Still another object is to provide a direct exposure system which compensates for non-planar, warped or non-uniform thickness conditions of the wafer being exposed. In this regard, an object of the present invention is to provide a wafer platform and related mechanism for automatically bringing the surface portion of the wafer being exposed into parallel alignment with the bottom of the camera. This aids perfect focus even though the camera optics may have a shallow depth of field.

Yet another objective of the present invention is to provide a system for accurately prealigning the wafer on the stage both rotationally and along orthogonal axes. Such prealignment eliminates rotational positioning errors of the wafer, and aids in obtaining accurate stepping through the array.

SUMMARY OF THE INVENTION

These and other objectives are achieved by providing a "single lens repeater" in which alignment of an image of a reticle pattern and a previous exposure on a semiconductor wafer is accomplished through the same camera lens system that is used to make the exposures. The exposures are made repetitively and sequentially at successive array locations on a wafer, and an appropriate wafer stepper system is used to move the wafer between each exposure.

The apparatus consists of a camera adapted directly to project a reduced image of a circuit pattern contained on a reticle onto a portion of a semiconductor wafer. During the initial masking operation a reticle is used which contains both a circuit pattern and an alignment target. The wafer stepping mechanism is used incrementally to move the wafer through an array of locations. At each such location, the camera exposes the wafer to an image of the reticle circuit pattern and alignment target.

After the appropriate semiconductor wafer processing steps have been carried out, the wafer is returned to the inventive apparatus for a subsequent masking operation through a second reticle. This reticle contains another circuit pattern, and an alignment pattern having a shape that is complimentary to the alignment target which was previously exposed at each array location on the wafer. The wafer stepper again moves the wafer incrementally to the same array positions as used initially. At each such position, an alignment operation can be carried out using the alignment target on the wafer, the alignment pattern on the second reticle, and the same camera lens system that is used to make each exposure.

To this end, a low intensity, narrow beam light source is used to illuminate an alignment target contained on the wafer. Appropriate viewing optics, typically including a beam splitter, a microscope lens system and a video camera, is used to view the virtual image of the wafer alignment target projected by the camera lens and the alignment pattern contained in the reticle. The stage holding the wafer can be moved to achieve perfect alignment between the target virtual image and the alignment pattern. When this is achieved, the usual camera light source is used to expose the wafer to an image of the circuit pattern of the second reticle. This exposure will be in exact overlapping alignment with the circuit previously exposed onto the wafer.

A system is disclosed for precisely prealigning the wafer beneath the camera before the step and repeat operation is carried out. This prealignment system uses an air gauge to find opposite edges of the wafer, from which orthogonal center lines of the wafer are established. A unique mounting arrangement is provided in which the wafer-supporting platform can be rotated about its vertical axis with no linear motion along the X-Y axes of the supporting table. This arrangement permits precise correction of any rotational error in the prealignment of the wafer.

The air gauge system also is used in conjunction with a spherical air bearing support for the wafer platform to accomplish parallel alignment of a portion of the wafer's surface and a reference plane through the camera. By accomplishing such parallel relationship, focusing or depth of field errors that might otherwise result from warpage or non-uniform thickness of the wafer are eliminated.

BRIEF DESCRIPTION OF THE DRAWINGS

A detailed description of the invention will be made with reference to the accompanying drawings wherein like numerals designate corresponding parts in the severapl Figures. The drawings are not necessarily to scale.

FIG. 1 is a prespective view of the inventive step and repeat apparatus for direct photo-exposure of a semiconductor wafer.

FIG. 2 is a top plan view of a wafer exposed using the apparaus of FIG. 1.

FIG. 3 is a top plan view of a reticle containing the initial image to be exposed onto the wafer being processed. This reticle includes the cruciform alignment target which is exposed onto the wafer at each image location, as shown in FIG. 2.

FIG. 4 is a top plan view of a reticle utilized in a later processing step. It contains a complementarily shaped target which is used to align the image of this reticle with the target previously provided on the wafer using the reticle of FIG. 3.

FIG. 5 is a diagrammatic view of the image alignment system used in the apparatus of FIG. 1. The virtual image of the target contained on the wafer is aligned with the complementarily shaped target on the reticle of FIG. 4 by utilizing a viewing system which operates directly through the main camera optics.

FIG. 6 is a fragmentary view of the wafer alignment target virtual image superimposed on the reticle alignment pattern, as seen through the optical system of FIG. 5.

FIG. 7 is a sectional view of the wafer supporting stage and wafer surface parallel alignment system utilized in the apparatus of FIG. 1.

FIG. 8 is a diagrammatic view of the rotational drive mechanism for the stage shown in FIG. 7.

FIGS. 9 and 10 are diagrammatic views illustrating prealignment of the wafer prior to step and repeat exposure thereof.

FIG. 11 is a fragmentary view like FIG. 6 as seen during the prealignment process.

DESCRIPION OF THE PREFERRED EMBODIMENT

The following description is of the best presently contemplated mode of carrying out the invention. This description is not to be taken in a limiting sense, but is made merely for the purpose of illustrating the general principles of the invention since the scope of the invention best is defined by the appended claims.

The apparatus 10 of FIG. 1 is used to expose directly and repetitively portions of a semiconductor wafer 11 (FIG. 2) to an image contained on a reticle 12 (FIG. 3 ) or 13 (FIG. 4). As described below in conjunction with FIG. 5, the alignment of each new image with a pattern previously placed on the wafer 11 is carried out through the same camera optics 14 that is used for the direct exposure of each reticle image. The apparatus 10 thus sometimes is called a "single lens repeater".

The apparatus 10 is mounted on a massive granite block 15 held by three supports 16. The mass of the block 15 isolates the apparatus 10 from external vibrational effects. A cassette 17 containing wafers to be exposed is placed in a load/unload module 18. One wafer at a time automatically is removed from the cassette 17 and transported on sets of O-ring belts 19 to a prealign station 20. There the wafer 11 is mechanically centered over a spindle 20' to which the wafer is held by a vacuum. The spindle 20' then is rotated until a flat edge 11f of the wafer 11 (FIG. 2) is in a known orientation. The wafer 11 is then said to be "pre-aligned".

The pre-aligned wafer 11 next is lifted off of the spindle 20' by the vacuum chuck of a transport mechanism 21. This mechanism moves the wafer 11 along a rail 22 until it is over a stage 23 (best shown in FIG. 7) that is used to support the wafer during the exposure process. The wafer is lowered from the transport mechanism 21 onto the stage 23 where it is again clamped in place by vacuum.

The stage 23 is moveable along two orthogonal (X-Y) axes by means of a precision X-Y drive system 24. A conventional laser interferometer 25 is used in conjunction with the drive system 24 to achieve very accurate X-Y positioning of the stage 23. After complete exposure of a wafer 11, the transport mechanism 21 is used to remove the wafer from the stage 23 and to transport it back onto the O-ring belts 19. These belts drive the wafer 11 to another cassette 17' in which the exposed wafers are automatically stacked.

The step and repeat direct exposure process is carried out with the wafer 11 situated on the stage 23. The exposure is performed with the appropriate reticle 12, 13 mounted in a reticle holder 28 that is pivotably attached to a support 29 near the top of the apparatus 10. Several different reticles 12, 13 may be premounted in corresponding openings 28' in the holder 28 and rotated into position in a camera 30 as required.

The camera 30 (FIGS. 1 and 5) includes a vertically mounted, generally cylindrical camera body 31 which contains appropriate optics 14 for focusing an image of the reticle 12, 13 pattern onto the wafer 11 that is mounted on the stage 23. The optics 24 is known per se, and may utilize one or a plurality of lenses to accomplish the requisite focusing operation. A high intensity exposure lamp 32 is used as a light source, typically at 4360 A, to expose photoresist on the wafer 11.

The reticle in use may be automatically aligned with the camera optics 14 by providing each reticle 12, 13 with a set of camera alignment marks 33, 33'. An appropriate mechanism (not shown) situated in a housing 34, may be used to detect the marks 33,33' and to control movement of the reticle holder 28 and/or its support 29 so as to locate the reticle 12, 13 precisely with respect the optics of the camera 30.

As described above, each wafer 11 undergoes a series of device fabrication steps, certain of which require separate masking or pattern exposure steps. During the initial masking operation, the reticle 12 (FIG. 3) is used. Only this first reticle contains a cruciform alignment target 35, an image of which is exposed onto the wafer 11 simultaneously with exposure of a pattern 36 contained on the same reticle 12.

Using a step and repeat direct exposure operation, multiple images of the pattern 36 and cruciform alignment target 35 are produced in a desired array 37 on the wafer 11 (FIG. 2). To this end, the stage 23 initially is positioned to an arbitrary location beneath the camera 30. Using the exposure lamp 32, a first exposure is made through the reticle 12 to produce on the wafer 11 an image 36-1 of the reticle pattern 36 and an image 35-1 of the cruciform alignment target 35. The drive system 24 then is used in conjunction with the laser interferometer 25 to move the stage 23 for a specific distance along the X-and/or Y-axis to a new position at which the next image is exposed. For example, the wafer 11 may be stepped along the Y-axis only to the next position at which the pattern image 36-2 and the target image 35-2 are exposed. In like manner, the wafer 11 is repetitively stepped and exposed until the complete pattern array 37 has been accomplished. At that time, the wafer 11 is transported off of the stage 23 and into the module 17'.

After the appropriate semiconductor processing steps have been carried out, the wafer 11 is returned to the apparatus 10 for the next masking operation. This operation utilizes the reticle 13 (FIG. 4) having an alignment pattern 40 that advantageously has a shape which is complementary to the alignment target 35 of the reticle 12. In the embodiment shown, the pattern 40 consists of four L-shaped elements 40' arranged to define an open cruciform area 40" corresponding in shape to the alignment target 35. The reticle 13 also contains a new pattern 41 which is different from the pattern 36, but which must be exposed onto the wafer 11 in precise overlapping alignment with the each image 36-1, 36-2 etc. that was produced using the first reticle 12.

To accomplish this, the reticle 13 is mounted in the holder 28 and positioned in the camera 30. The marks 33' are used to align the reticle 13 with the camera optics 14. The stage 23, containing the wafer 11 having the previously exposed array 37, then is positioned so that a certain one of the previous images (for example, the image 36-1) is beneath the camera 30. The manner in which this is accomplished is described below.

Next the pattern 40 and the previously exposed image of the alignment target 35 are used to achieve perfect overlapping alignment between an image of the reticle pattern 41 and the previously exposed image of the pattern 36. To this end, a virtual image 35-1' (FIG. 6) of the wafer alignment target 35-1 is viewed directly through the camera optics 14. The stage 23 is moved appropriately so that this virtual image 35-1' of the target 35-1 (that was previously produced on the wafer 11) is precisely aligned with the alignment pattern 40 on the reticle 13. When the desired alignment is achieved, the overlapping alignment pattern 40 and virtual image target 35-1' will have the appearance shown in FIG. 6 when viewed through the optics 49. When this alignment is achieved, the lamp 32 is flashed to expose the wafer 11 to an image of the pattern 41. Perfect alignment is achieved. The stage 23 then is moved along the X- and/or Y-axis to the next image position, and the process is repeated.

To facilitate this alignment operation, a separate low intensity light source 42 is used to illuminate the wafer alignment target 35-1 through the camera optics 14, as shown in FIG. 5. The light source 42 may be of sufficiently low intensity so that it does not significantly expose the photoresist on the wafer 11. The wavelength of the light source may be the same as that of the high intensity flash lamp 32. Light 43 from the lamp 42 passes through a beam splitter 44 and through the pattern 40 on the reticle 13 so as to produce the illumination at the location of the target 35-1. The virtual image of the wafer alignment target 35-1 is projected back through the reduction lens 14 and is focused at the reticle 12 plane. Light reflected back from the wafer 11 also transilluminates the reticle pattern 40. The virtual image of the alignment target 35-1 and the pattern 40 are simultaneously viewed through the optics 49 via the beam splitter 44, a prism 45 and a video camera 46 shown diagrammatically in FIG. 5 and contained within a housing 47 of FIG. 1. Microscope viewing optics 48 may be associated with the camera 46. When alignment is achieved, the image produced on a video screen (not shown) associated with the video camera 46 will have the appearance shown in FIG. 6.

After the exposure of each image of the pattern 41 onto one of the previous patterns 36-1, 36-2 etc., the drive system 24 and laser interferometer 25 are used to move the stage 23 and wafer 11 so that the next pattern in the array 37 is in position for exposure. The distance and direction of motion from step to step typically will correspond to the distances and directions used to step the wafer 11 when the initial array 37 was exposed from the reticle 12. At each step the pattern virtual image (e.g., the image 35-1') of the corresponding target 35-1, 35-2, etc., may be viewed using the light source 42 and the video camera 46. A conventional joy stick or other control (not shown) may be used in conjunction with the drive system 24 and lasser interferometer 25 to allow an operator finely to adjust the position of the stage 23 so that perfect target alignment (like that shown in FIG. 6) is achieved. This may be done for each individual exposure in the array 37. Alternatively, if the positioning capability of the drive system 24 and interferometer 25 is sufficiently accurate visual realignment need only be carried out once, twice or just a few times for each row or column of the array 37, rather than at each position. By providing an individual alignment target 35-1, 35-2 etc. at each array position, the opportunity is presented to carry out an alignment individually for every exposure.

Typically the camera optics 14 will have a very shallow depth of focus. If the thickness of the wafer 11 is non-uniform, the image produced by the camera 30 on one portion of the wafer 11 may be in focus, while the image produced at another location may be out of focus. With this to be the case, the full potentialities of the system 10 for fine alignment and high resolution may be lost. The wafer leveling system illustrated in FIG. 7 is intended to eliminate this problem, which may arise due to the wafer itself having a wedge-shaped cross-section or because the wafer has become warped during processing.

Referring thereto, the stage 23 includes a moveable table 50 which itself is driven along the X- and Y-axis by the drive system 24 and the interferometer 25. Interconnection between the table 50 and the drive system 24 is conventional, and is omitted from the drawings for the sake of clarity. Mounted to the table 50 is the stationary base 51 of a spherical air bearing support 52 for a platform 53. The platform 53 is attached by bolts 54 to a generally hemispherical bearing 55 that seats within the hemispherical, concave upper surface 56 of the base 51. The wafer 11' being exposed is held by vacuum to the top of the platform 53.

A series 57, 58, 59 of annular grooves are formed on the surface 56 of the bearing. The groove 57 communicates via a channel 60 in the base 51 to a connector 61 that is connected to a vacuum. The groove 58 is vented to atmospheric pressure via a vent channel 62 through the base 51. With the arrangement, a vacuum applied to the connector 61 will cause the bearing 55 and the platform 53 to be held frimly in place with respect to the base 51. The vacuum channel 60 also communicates via a channel 63 through the bearing 55 and the platform 53 to one or more openings on the upper surface of the platform 53 beneath the wafer 11'. With this arrangement, the same vacuum applied to the connector 61 also will hold the wafer 11' firmly in place atop the platform 53. An alternative design may have the wafer holding vacuum supplied separately from that used to clamp the two halves of the air bearing.

The groove 59 communicates via a channel 64 to a connector 65 that is attached to a source of air or other gas under positive pressure. Normally a vacuum is continously provided at the connector 61. When it is necessary to change the orientation of the platform 53, gas under pressure is supplied to the connector 65. The pressure of this gas, applied via the groove 59 to the inner surface 56 of the base 51 overcomes the "holding force" of the vacuum and forms an air support for the bearing 55. As a result, the bearing 55 and the platform 53 can be positioned with respect to the base 51 by the application of a very small force to the platform 53 or the wafer 11'. When the desired platform orientation is achieved, the pressurized gas is disconnected from the connector 65 and the vacuum immediately locks the bearing 55 in place with respect to the base 51.

This air bearing support mechanism 52 is used to facilitate the parallel alignment of the top surface 11T of the wafer 11' with a reference plane such as the plane of the lower end 31L of the camera housing 31.

To this end, contained within the housing 31 are a plurality (typically three) of air ducts 68, 68'. Advantageously these are spaced around the periphery of the housing 31, for example at 120° intervals. A source (not shown) of air or other gas under pressure is connected to the upper ends of the ducts 68, 68'. Some of this air escapes via the open lower ends 68a, 68a of the ducts 68, 68' so as to form a set of air jets 69, 69'. The pressure of the air in each of the ducts may be sensed by a corresponding pressure sensor 70, 70' contained within the housing 31.

To accomplish parallel alignment of the wafer 11', air under pressure is applied to the connector 65 so that the platform 53 and wafer 11' are free to move on the spherical air bearing support 52. The camera body 31 then is lowered toward the wafer 11, with air under pressure supplied to the ducts 68 and 68'. The resultant air jets 69, 69' exert a force on the wafer 11' and the platform 53. If the wafer surface 11T is not parallel with the housing and 11L, the force exerted by the individual air jets 69, 69' will not be equal. As a result, the unequal forces will cause the wafer 11' and platform 53 to move with respect to the spherical air bearing support 52 until a condition of equilibrium is achieved at which the force exerted by all of the air jets 69, 69' is equal. This will occur when the spacing between the duct openings 68a and 68a' and the surface of the wafer 11' are equal; i.e., it will occur when the wafer top surface 11T is parallel to the housing bottom 31L. This condition is sensed by the occurance of equal back pressures at all of the sensors 70, 70'. Appropriate control circuitry (not shown) responsive to this equal back pressure condition causes the supply of pressurized air to the connector 65 to be turned off. As a result, the bearing 55 will immediately be locked by vacuum to the base 51, thereby rigidly holding the platform 53 and the wafer 11' in the desired position with the upper surface 11T parallel to the camera bottom 31L.

FIG. 7 is not necessarily drawn to scale. The wedge shaped cross-section of the wafer 11 has been exaggerated for emphasis. Further, in practice the diameter of the housing 31 may be substantially smaller then the diameter of the wafer 11'. Thus the parallel alignment may be accomplished over a relatively smaller area of the wafer 11' than is illustrated in FIG. 7. The parallel alignment may be accomplished before each exposure, or it may be done only once or a few times during the step and repeat exposure of the entire wafer 11.

The system of FIG. 7 or a similarly utilized series of jets at a differential physical location also may be used to accomplish very accurate focusing of the camera 30 once the above described parallel alignment has been achieved. The air jets 69, 69' and back pressure sensors 70, 70' also are used to accomplish such focusing.

Exact focus is achieved when the camera optical system 14 is spaced a precise distance from the wafer top surface 11T. At this spacing, a certain back pressure will be present at the sensors 70, 70'. Thus focusing can be achieved by gradually lowering the camera body 31 toward the wafer 11' while monitoring the back pressure level detected by the sensors 70, 70'. As the camera body is lowered, this back pressure will increase concomitantly. When the predetermined pressure corresponding to the distance of exact focus is detected, downward movement of the body 31 is stopped. Perfect focus is achieved. This focusing operation may be carried out before each individual exposure in the array 37.

The air jet back pressure sensing system or "air gauge" just described in connection with wafer leveling and focusing also may be used as an aid to automatic precise prealignment of the wafer 11. As described above, prior to making the initial exposure using the reticle 13, the wafer 11 is prealigned and set to a position at which the image 40a (FIG. 6) should be quite close to the alignment target 35-1 on the wafer 11. If the wafer 11 is properly prealigned, the target 35-1 will appear within the field of view of the video camera 46. However, this field of vision is very small (typically on the order of 0.002 inches square) so that accurate prealignment is required to insure that the target 35-1 will appear within the field of vision of the camera 46. Furthermore, it is important that the angular orientation of the wafer 11 on the stage 23 be correct, for example with the loci of targets 35-1, 35-2 etc. aligned parallel to the X- and Y-axes of the drive system 24. This is necessary so that as the wafer 11 is stepped along the X- and/or Y-axes between successive exposures, each successive target 35-2, 35-3 etc. in turn will appear within the field of view of the video camera 46.

As discussed above, a prealignment of the wafer flat edge 11f is carried out at the prealigned station 20. Thus when the wafer 11 is placed on the stage 23, the flat edge 11f is roughly aligned with one of the axes (typically the X- axis) of the drive system 24. One of the air jets in the camera housing 31 (for example, the air jet 69 and the associated pressure sensor 70) then is used accurately to determine the center of the wafer 11. The technique is illustrated in FIG. 9.

First, the stage 23 is moved parallel to the Y-axis until the air jet 69 is situated along an arbitrary line 75 (FIG. 9) parallel to the X-axis but spaced away from the horizontal center line 76 of the wafer 11. Then the drive system 24 is used to move the stage 23 parallel to its X-axis 73 until the locations of the wafer edges 75L and 75R are detected. For example, the stage 23 first may be transported toward the right as viewed in FIG. 9, so that the line 75 defines the path of the air jet 69 with respect to the moving wafer 11. When the edge 75L of the wafer 11 is reached, the back pressure detected by the sensor 70 will immediately decrease. The sensor 70 will send a corresponding signal to a computer (not shown) which in conjunction with the laser interferometer system 25 will establish a location or reference position for the edge point 75L along the line 75. The stage 23 then is moved in the opposite or leftward direction, and the air jet 69 and sensor 70 are used to detect the position of the opposite edge 75R. Once these two positions are known, the corresponding length along the line 75 (that is, the distance between edge points 75L and 75R) is divided by two (by the computer) to establish the position of the midpoint 75c along the line 75.

This measurement technique preferably is repeated several times along different lines 77, 78 parallel to the line 75. As a result, a set of points 75c, 77c, 78c will be determined, the average locations of which will establish a vertical center line 79 for the wafer 11. This process also will eliminate errors that might be introduced if e.g., a notch or irregularity should be present along the edge of the wafer 11 where it is intersected by one of the lines 75, 77 or 78.

Next, the same process is used in the orthogonal direction to locate the center line 76. To this end, the stage 23 is moved parallel to the X-axis 73 until the air jet 69 is situated along a vertical line 81 (FIG. 9) which does not intersect the flat 11f. The stage 23 then is moved only parallel to its Y-axis and the air jet 69 and sensor 70 are used to locate the points 81T and 81B at which the line 81 intersects the "top" and "bottom" of the wafer 11. Again, the computer and the laser interferometer 25 cooperate to obtain these measurements and to calculate the center 81c of the line 81.

The process then is repeated at one or more vertical lines 82 to obtain one or more center points 82c. The points 81c, 82c then will define the position of the horizontal center line 76. The intersection 83 of the center lines 76 and 79 defines the center of the wafer 11. That is, the precise location of the center 83 now is established with respect to an arbitrary reference point for the X- and Y-axes 73,74 with respect to which the drive system 24 and the laser interferometer 25 position the table 23.

During the initial masking operations for the wafer 11 using the reticle 12, the step and repeat positioning which determined the array 37 (FIG. 2) advantageously is done with reference to the center point 83 and the center lines 76 and 79 established using the procedure just described in conjunction with FIG. 9. However, for each subsequent masking operation using a reticle 13 an additional prealignment procedure, illustrated in FIGS. 10 and 11, preferably is used to eliminate any rotational error in the positioning of the wafer 11.

With the reticle 13 in place, the center 83 of the wafer 11 is established as just described. If a rotational error is present, the established center lines 76 and 79 will not be parallel to the stage X- and Y-axes to which the alignment targets 35-1, 35-2 etc. of the array 37 are referenced. To correct this rotational error, the system 24 first is used to drive the wafer 23 until a certain alignment target 35-C (FIG. 10) near the center of the wafer 11 is situated beneath the camera 30 in a located at which, if the prealignment were perfect, its virtual image would coincide with the reticle alignment pattern 40. Since this target 35-C is close to the center 83 of the wafer 11, even if a fairly substantial rotational wafer positioning error exists, the target 35-C should appear within the field of view of the video camera 46.

The operator then can use an appropriate manual control such as a joy stick (not shown) to cause the drive system 24 to move the stage 23 along the X- and/or Y-axes 73, 74 until the virtual image of the alignment target 35-C is in close alignment with the pattern 40 on the reticle 13. At this time, the operator can push a button (not shown) to cause the associated computer to record this position of the target 35-C.

Next the stage 23 is moved along either the X- or Y-axis to the anticipated position of another alignment target 35-D which is further from the wafer center 83. If there is a rotational error, the relationship between the reticle pattern 40 and the alignment target 35-D virtual images may be like that illustrated in FIG. 11. Again the operator uses the joy stick or like control to move the stage along the X- and Y-axes until the alignment target 35-D is centered with respect to the alignment image 40a. At that time the new wafer position is entered into the computer.

It will be apparent that as this operation is repeated, the X- axis and/or Y-axis corrections which are necessary at each point to align the targets 35-C, 35-D etc. are directly indicative of the rotational error $\theta$ in positioning of the wafer 11. After trigonometrically computing $\theta$, the mechanism of FIG. 8 may be used to rotate the base 51 and platform 53 supporting the wafer 11 with respect to the wafer center 83 through a corresponding angle $\theta$. This will eliminate the rotational wafer positioning error.

To accomplish this $\theta$ correction, the base 51 is mounted atop the table 50 in a manner which permits very fine angular rotation of the base with no concomitant translation along the X- or Y-axes. To this end, the underside of the base 51 contains a cylindrical recess 85 within which are attached the ends 86a of three flexure arms 86-1, 86-2, 86-3. The outer ends 86b of these arms 86 are connected by means of fixtures 87 to the table 50. Each arm 86 extends through a respective slot 88 through the cylindrical lower wall of the base 52. A rigid arm 89 is attached to and extends outwardly from the base 51.

With this arrangement, as the outer end 89a of the arm 89 is moved to the left or right (as viewed in FIG. 8), the base 51 and the platform 53 will rotate about the central vertical axis of the base 51. This rotational motion is accommodated by flexure of all of the arms 86. However, the arms 86 will prevent the base 51 from moving laterally (i.e., parallel to either the X- or Y-axis) with respect to the table 50. A purely rotational correction is achieved.

Motion is imparted to the arm 89 by a motor 91 which rotates a shaft 92 having a screw threaded portion 93. The end of the shaft 92 is journaled in a bearing 94 that is attached to the table 50.

The shaft 92 threadingly engages the interior of an opening through one end of a rigid arm 95, the other end of which is pivotally attached by means of a flexure joint 96 to a connecting arm 97 that in turn is connected to outer end 89a of the arm 89 by means of another flexure joint 98. The beam 95 is pivotably mounted with respect to the table 50 by means of a rigid fixture 99 that is pivotably connected to the arm 95 by means of a flexure joint 100.

With this arrangement, when the motor 91 is driven in one direction (e.g., clockwise), the threads 93 cause the arm 95 to pivot around the mounting 100, thereby imparting left or rightward motion via the arm 97 to the arm 89. As a result, the base 51 and the platform 53 will be rotated in a corresponding angular direction. Opposite rotation of the motor 91 causes concomitant rotation of the base 51 in the opposite direction. An encoder 101 connected to the shaft 92 provides an output signal which is indicative of the extent of rotation of the motor 91, and hence indicates the angular amount by which the base 51 has been rotated.

The motor 91 may be controlled automatically by the computer (not shown) that is used in the manner described above to establish the rotational positioning error $\theta$ of the wafer 11. When the motor 91 is energized, the encoder 101 will feed back to the computer a signal indicating the extent of rotation imparted to the base 51. In response to this signal, the motor 91 can be properly de-energized when the desired correction angle $\theta$ has been achieved. In this manner, rotational correction in the positioning of the wafer 11 can be established automatically and with very high accuracy.

Once this rotational positioning error has been corrected, it will be apparent that effective center lines 76 and 79 of the wafer 11 will now be aligned parallel to X- and Y-axes 73,74 associated with the stage 23, and moreover that all of the alignment targets 35-1, 35-2 etc. also will be correctly aligned with respect to the stage X- and Y-axes. Accordingly, during the step and repeat process, if the wafer 11 is stepped through the same distances and directions as were used during initial exposure of the wafer 11 to create the array 37 (FIG. 2), the reticle alignment pattern image 40 will in each case be very close to the corresponding alignment target 35-1, 35-2 etc. Minor corrections can be made if necessary for the operator using the joy stick. Perfect alignment of the image of the pattern 41 from the reticle 13 with the previously exposed images 36-1, 36-2 etc. will be achieved at at every array position.

We claim:

1. An apparatus useful in a semiconductor wafer photo-exposure system of the type having a camera for exposing said wafer to produce semiconductor devices, said apparatus achieving spaced parallel alignment of the surface of said semiconductor wafer with a reference plane that is associated with the body of the camera of said system and is in spaced facing relationship with said wafer surface, comprising:

a platform for supporting said wafer;

a spherical air bearing mounting for said platform, a plurality of channels in said camera body for conducting gas under pressure to openings in said camera body facing said wafer surface so as to form gas jets directed toward said semiconductor wafer, pressure sensor associated with each of said channels to sense the gas back-pressure therewithin, means for applying gas via said channels so that the force of said gas jets applied against said wafer will cause said wafer and said platform to move within said air bearing mounting until the back-pressure condition indicating that the distance from each of said openings to said wafer surface is equal, whereby said parallel alignment between said semiconductor wafer and the reference plane of said camera body is achieved, vacuum clamping means for locking with said spherical air bearing mounting to prevent further movement of said platform therewithin, said vacuum clamping means being actuated upon detection by said sensors of said equal back-pressure condition, and means for moving said camera body toward and away from said semiconductor wafer, and focusing means for causing said moving means to move said body relative to said wafer until the level of back pressure uniformly sensed at all of said sensors is equal to a preselected value, said value corresponding to a spacing between said body end and with wafer at which said camera is exactly focused on said surface.

2. An apparatus according to claim 1 wherein said spherical air bearing itself is mounted on a table that is moveable beneath said camera body, together with:
drive means for driving said table along orthogonal axes with respect to said camera body, and
separate means for rotating said spherical air bearing mounting and said platform with respect to said table without translation of said mounting parallel to either of said orthogonal axes.

3. Mounting means according to claim 2 together with:
means for simultaneously viewing, through the same camera lens system used for image photo-exposure onto said wafer, (a) an alignment pattern contained on the reticle utilized by said camera and (b) the virtual image of an alignment target previously provided on said semiconductor wafer, and
control means for directing said drive means to drive said table along said orthogonal axes to a plurality of positions at which alignment of said reticle alignment pattern and virtual images of other alignment targets on said wafer is expected, and for directing said separate means to impart rotation to said platform, to correct for any rotational error in the alignment of said wafer detected during said directed movement.

4. Apparatus for use in a step and repeat direct exposure system for processing semiconductor wafers, which system includes a camera for exposing an image onto said wafer, said apparatus including position locating means comprising:
a stage on which said semiconductor wafer is mounted,
stage drive means for moving said stage along orthogonal X- and Y-axes,
air jet means, situated above said wafer, for directing a jet of air under pressure toward said wafer, said air jet means including a first sensor for sensing the back pressure of said directed air, and
control means for causing said stage drive means to move said stage parallel to one of said orthogonal axes and for detecting the positions of the opposite edges of said wafer along said one axis by sensing the change in back pressure of said directed air as said jet of air moves across said opposite edges, said control means thereafter utilizing said detected edge positions to determine a first centerline location of said wafer,
said air jet means being situated in the body of said camera, said camera body being moveable toward and away from said wafer, together with focusing means for moving said body toward or away from said wafer until the back pressure sensed by said first sensor corresponds to a certain value, said certain value occurring only when said camera is situated for correct focus of said exposure on said wafer.

5. Apparatus according to claim 4 wherein said control means further causes said stage drive means to move said platform along the other of said orthogonal axes while using said air jet means to detect the locations of opposite edges of said wafer along a line parallel to the other of said orthogonal axes, said control means thereafter utilizing said detected locations to determine another centerline of said wafer orthogonal to said first centerline.

6. Apparatus according to claim 5 wherein said stage includes a mounting platform for said semiconductor wafer and a support for said platform, said support having rotational positioning means for changing the angular orientation of said support and platform with respect to an axis generally perpendicular to said supported wafer without concomitant linear movement of said support along said orthogonal axes.

7. Apparatus for use in a step and repeat direct exposure system for processing semiconductor wafers, said apparatus including position locating means comprising:
a stage on which said semiconductor wafer is mounted,
stage drive means for moving said stage along orthogonal X- and Y-axes,
air jet means, situated above said wafer, for directing a jet of air under pressure toward said wafer, said air jet means including a first sensor for sensing the back pressure of said directed air, and
control means for causing said stage drive means to move said stage parallel to one of said orthogonal axes and for detecting the positions of the opposite edges of said wafer along said one axis by sensing the change in back pressure of said directed air as said jet of air moves across said opposite edges, said control means thereafter utilizing said detected edge positions to determine a first centerline location of said wafer,
said exposure system including a camera for exposing an image onto said wafer, and wherein such air jet means includes a plurality of spaced air jets directed toward the surface of said wafer, each of said plural air jets having a corresponding back pressure sensor, and wherein:
such stage includes a mounting platform for said semiconductor wafer, said platform being supported by an air bearing, together with:
means for permitting said platform and wafer to move with respect to said air bearing under pressure exerted against said wafer by said plural air jets, and for locking said air bearing so as to prevent further movement of said platform and wafer when the back pressures detected by all of said sensors are equal, this condition being indicative of parallel alignment between a portion of said wafer surface and a reference plane of same camera.

8. Apparatus according to claim 7 wherein said control means further causes said stage drive means to step said mounted wafer incrementally to a preselected array of locations with respect to said camera, said camera exposing said image onto said wafer at each of said locations.

9. Apparatus according to claim 8 wherein:
said camera initially exposes said wafer from a first reticle containing a circuit pattern and an alignment target, whereby after said wafer has been stepped through said array of locations and the exposure repeated at each such location, such wafer will contain an array of exposed circuit patterns each having an associated exposed alignment target, and wherein:
said camera subsequently exposes said wafer from a second reticle containing a different circuit pattern and an alignment pattern shaped complimentarily to said alignment target, and wherein said apparatus includes:

alignment viewing means for simultaneously viewing at each array location, through the same camera lens system used to expose said wafer, said second reticle alignment pattern and a virtual image of an exposed alignment target on said wafer, said stage being moveable so as to achieve precise alignment of said simultaneously viewed virtual image and pattern, said camera performing said subsequent exposure when such precise alignment has been achieved, whereby the exposed image of said different circuit pattern will be in precise overlapping relationship with said exposed circuit pattern on said wafer at each array location.

10. A step and repeat direct photoexposure system for use in the fabrication of semiconductor wafers, comprising:

a moveable stage for supporting a semiconductor wafer, a stage drive means for driving said stage along orthogonal axes through predetermined distances, a stage rotation means for rotating said stage through a controlled angle without translation along said orthogonal axes, a projection camera including a camera lens for projecting a reduced image of a device pattern from a reticle onto a wafer supported on said stage, a high intensity light source means for exposing said device pattern from said reticle onto said wafer through said camera lens, a first reticle having an initial device pattern and an alignment target, a first control means, operative initially with said first reticle in said camera and with said stage supporting a semiconductor wafer having no previously exposed array thereon, for aligning said first reticle with the projection camera and thereafter for causing said drive means to step said stage along said orthogonal axes to successive different positions, and for causing said camera and said high intensity light source means to expose an image of said first reticle onto said wafer at each of said positions, thereby to produce on said wafer an array of previously exposed patterns each having an associated alignment target, said alignment targets all being lined up substantially parallel to said orthogonal axes, a second reticle including a second device pattern and an alignment pattern of shape complementary to said alignment target, second control means, operative when said wafer containing an array of previously exposed patterns is on said stage and said second reticle is in said camera, for similarly aligning said second reticle with the projection camera and thereafter for sequentially stepping said stage to at least two different positions at which said alignment pattern will be in approximate alignment with a virtual image of a respective one of said alignment targets on said wafer, a separate low intensity light source means for illuminating said wafer alignment target, light from said separate light source means being directed obliquely through the region of said second reticle containing said alignment pattern and thence through said camera lens to illuminate said wafer in the region of said wafer alignment target, the wavelength of said separate light source means being the same as said high intensity light source means, said separate light source means being of sufficiently low intensity so as to not significantly expose photosensitive material on said semiconductor wafer, said same camera lens projecting a virtual image of the wafer alignment target from the illuminated region of said wafer onto the plane of said reticle in said region containing said alignment pattern, a video camera or like optical viewing means, viewing optics, situated in the light path between said reticle and said viewing means, for forming at said viewing means an image of (a) the virtual image of said wafer alignment target that is projected onto the plane of said reticle, and (b) the transilluminated reticle alignment pattern, third control means for causing said stage drive means to move said stage and supported wafer relative to the camera so as to accomplish exact alignment of said projected virtual image and said transilluminated alignment pattern while these are simultaneously viewed through said video camera or like viewing means at each of said at least two different positions, and for establishing from the determined positions of said wafer alignment targets at said at least two positions the extent of rotational error of said wafer from an orientation in which said wafer targets are all lined up with said orthogonal axes, and for thereafter causing said stage rotation means to rotate said stage by a corresponding angle so as to line up said alignment targets with said orthogonal axes, fourth control means for thereafter causing said stage drive means to move said stage and supported wafer only along one or the other of said orthogonal axes to successive image positions in a row or column of said array, and at each such position to finely move said stage and supported wafer along said orthogonal axes to obtain exact alignment, as viewed through said viewing means, between the alignment target at the location and the second reticle alignment pattern, and exposure control means, operable when said wafer has been moved into said exact alignment as viewed through said viewing means, for operating said high intensity light source means so as to expose an image of said second reticle device pattern onto said wafer in precise overlapping alignment with a previously exposed pattern in said array, said fourth control means thereafter causing the stage drive means to move said stage to the next successive image position, wherein:

all of the reticles used in said system subsequent to said second reticle contain a respective subsequent device pattern and an alignment pattern of shape complementary to said alignment target, the relative positions of the alignment pattern and the respective subsequent device pattern on each of said second reticle and subsequently used reticles being identical, and wherein:

said second control means, said third control means and said exposure control means also are operative when each one of said subsequently used reticles is in said camera, for accomplishing, at each of said positions, (a) alignment of the alignment pattern on said one subsequently used reticle with the same, initially formed wafer alignment target, and (b) exposure of the respective subsequent device pattern onto said wafer.

* * * * *